US007666713B2

(12) United States Patent
Kimura

(10) Patent No.: US 7,666,713 B2
(45) Date of Patent: Feb. 23, 2010

(54) METHOD FOR BONDING HEATSINK AND SEMICONDUCTOR DEVICE WITH HEATSINK

(75) Inventor: Hideki Kimura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 90 days.

(21) Appl. No.: 11/387,769

(22) Filed: Mar. 24, 2006

(65) Prior Publication Data

US 2007/0224734 A1    Sep. 27, 2007

(51) Int. Cl.
*H01L 21/00* (2006.01)
(52) U.S. Cl. .............................. 438/122; 257/E21.499; 257/E21.51; 438/118; 438/119; 156/87; 156/295
(58) Field of Classification Search .................. 438/122, 438/118, 119; 156/87, 295; 257/E21.499, 257/E21.51; 738/118, 119, 122
See application file for complete search history.

(56) References Cited

U.S. PATENT DOCUMENTS

| 5,533,256 | A | * | 7/1996 | Call et al. ..................... 29/840 |
| 5,686,361 | A | * | 11/1997 | Ootsuki ....................... 438/118 |
| 5,854,664 | A | * | 12/1998 | Inoue et al. ................... 349/92 |
| 5,981,310 | A | * | 11/1999 | DiGiacomo et al. ......... 438/106 |
| 2005/0140028 | A1 | * | 6/2005 | Venkateswaran ............ 257/782 |

* cited by examiner

*Primary Examiner*—Eugene Lee
*Assistant Examiner*—Peniel M Gumedzoe
(74) *Attorney, Agent, or Firm*—Kratz, Quintos & Hanson, LLP

(57) ABSTRACT

A simple method for bonding a heatsink for improving heat-radiating efficiency, comprising the steps of sticking a double-sided adhesive tape to an end portion on an adhesion surface of at least either the heatsink or the semiconductor device; applying an adhesive onto the adhesion surface of at least either the heatsink or the semiconductor device; bringing the end portion into contact with a corresponding portion of the other one of the heatsink or the semiconductor device; and turning at least either the heatsink or the semiconductor device with the contacting portion as a rotation center to bond together the adhesion surfaces of the heatsink and the semiconductor device.

4 Claims, 6 Drawing Sheets

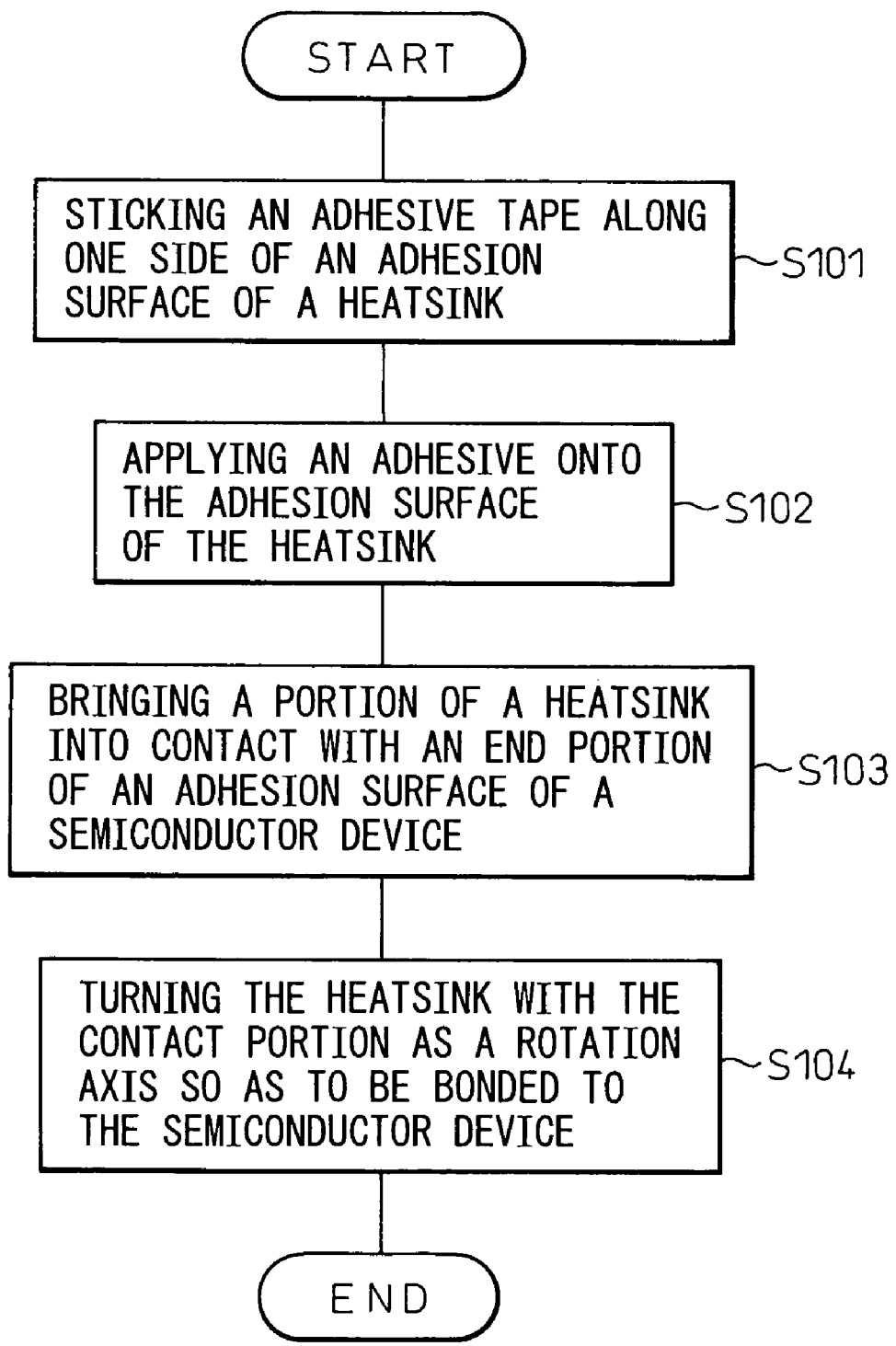

METHOD FOR BONDING HEATSINK AND SEMICONDUCTOR DEVICE WITH HEATSINK

BACKGROUND OF THE INVENTION

1. Field of the Invention

The present invention relates to a method for bonding a heatsink and to a semiconductor device with a heatsink. More specifically, the invention relates to a method for bonding a heatsink to a semiconductor device by using an adhesive, and to a semiconductor device having a heatsink bonded by the above method for bonding.

2. Description of the Related Art

In recent years, radiating the heat generated in a semiconductor device is becoming a problem accompanying the integration of semiconductor devices and an increase in the operation frequency. To radiate the heat of the semiconductor device, it is becoming a general practice to adhere a heat-radiating heatsink to the semiconductor device. To bond the heatsink to the semiconductor device, there is used an adhesive having a low heat resistance and a coefficient of thermal expansion comparable to those of the heatsink and the semiconductor device. However, a period of several hours up to about one day is required for the adhesive to exhibit a sufficiently large fixing strength for bonding the semiconductor device to the heatsink. So far, therefore, a double-sided adhesive tape is used to temporarily fix the heatsink to the semiconductor device until the adhesive exhibits a sufficiently large fixing strength.

Usually, however, the heat resistance of the double-sided adhesive tape is much larger than the heat resistance of the adhesive. Therefore, the heat-radiating characteristics decrease with an increase in the area of the double-sided adhesive tape that occupies the adhesion surface between the heatsink and the semiconductor device. For example, the double-sided adhesive tape used for temporarily fixing the heatsink has a heat resistance of about 0.3° C./W. On the other hand, a silicon adhesive used for bonding the heatsink to the semiconductor device has a heat resistance of about 0.01° C./W. It is therefore desired that the above double-sided adhesive tape has an area which is as small as possible.

Further, when there is used a highly viscous adhesive, it may happen that the fixing strength at the time of temporary fixing decreases as the adhesive applied onto the adhesion surface of the heatsink or of the semiconductor device spreads and flows in between the double-sided adhesive tape and the semiconductor device at the time when the heatsink is pushed onto the semiconductor device.

Further, in order to prevent the adhesive from flowing in between the double-sided adhesive tape and the semiconductor device, it can be contrived to apply the adhesive in a predetermined shape by taking into consideration how the adhesive spreads. In this case, however, an increased number of operation steps is required for applying the adhesive and, as a result, an increased cost is required for bonding the heatsink to the semiconductor device.

Therefore, it has been desired to develop a method for bonding the heatsink to the semiconductor device for improving the heat-radiating efficiency.

SUMMARY OF THE INVENTION

In view of the above circumstances, it is an object of the present invention to provide a method for bonding a heatsink and a semiconductor device together in a simple manner enhancing the heat-radiating efficiency. The present invention further has an object of providing a device for bonding the heatsink and the semiconductor device together to realize the bonding method. It is a further object of the present invention to provide a semiconductor device which features an improved heat-radiating efficiency at a decreased cost.

In order to achieve the above objects, a method for bonding a heatsink of the invention comprises sticking a member having adhesiveness such as a double-sided adhesive tape to an end portion on an adhesion surface of either a heatsink or a semiconductor device to which the heatsink is to be bonded, applying an adhesive to the adhesion surface of either one of them, bringing the end portion to which the double-sided adhesive tape is stuck into contact with a corresponding portion of the other one of the heatsink or the object to which the heatsink is to be bonded, and turning either the heatsink or the object to which the heatsink is to be bonded with the contacting portion as a rotation center to bond together the adhesion surfaces of the heatsink and the object to which the heatsink is to be bonded.

The member having adhesiveness has adhesiveness on the side facing a member different from the heatsink to which the member is stuck or from the object to which the heatsink is to be bonded.

In the bonding method of the invention, it is desired that a portion corresponding to the end portion of the heatsink in the step of contact is any side of the adhesion surface of the object to which the heatsink is to be bonded.

In the bonding method of the invention, further, it is desired that, in the step of application, the adhesive is applied onto a portion of the adhesion surface, and the portion is nearly the center of the region to where no double-sided adhesive tape has been stuck on the adhesion surface of the heatsink or the object to which the heatsink is to be bonded.

In the bonding method of the invention, further, it is desired that, in the step of application, the adhesive is applied onto a portion of the adhesion surface, and the portion lies closer to the double-sided adhesive tape than the center of a region to where no double-sided adhesive tape has been stuck on the adhesion surface of the heatsink or the object to which the heatsink is to be bonded.

The bonding method of the invention can be further used for adhering members other than the heatsink and/or the semiconductor device.

Further, a semiconductor device according to the present invention comprises a heatsink for radiating the heat generated by the semiconductor device and an adhesive layer for bonding the heatsink and the semiconductor device together, wherein an end portion of the adhesive layer is constituted by a double-sided adhesive tape, and the portions of the adhesive layer other than the end portion are constituted by an adhesive.

BRIEF DESCRIPTION OF THE DRAWINGS

FIG. 4 is a flowchart illustrating a method for bonding a heatsink and a semiconductor device together according to an embodiment of the present invention;

DESCRIPTION OF THE PREFERRED EMBODIMENTS

Described below with reference to the drawings, first, is a conventional method for bonding a heatsink and a semiconductor device together for comparison with an embodiment of the present invention. The conventional method for bonding the heatsink and the semiconductor device together includes (a) a step of sticking a double-sided adhesive tape onto the adhesion surface of the heatsink, (b) a step of applying an adhesive onto nearly the center of the adhesion surface of the heatsink, and (c) a step of bonding the heatsink and the semiconductor device together.

Figure 1A:
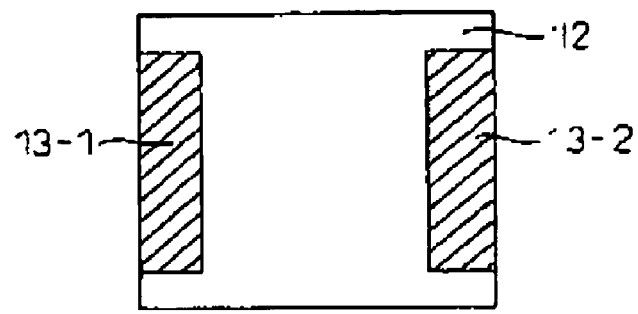
FIG. 1A is a schematic plan view of an adhesion surface of a heatsink in a step of sticking a double-sided adhesive tape for temporary fixing according to a conventional method for bonding the heatsink and a semiconductor device together.
Figure 1B:
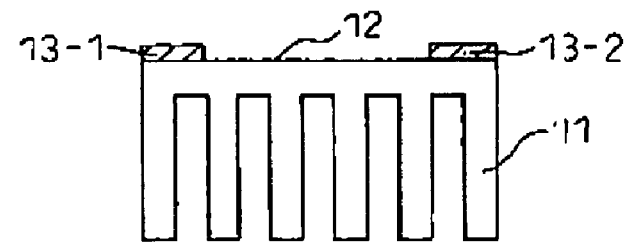
FIG. 1B is a schematic side view of the heatsink in the step of sticking the double-sided adhesive tape for temporary fixing according to the conventional method for bonding the heatsink and the semiconductor device together.

FIG. 1A is a schematic plan view of an adhesion surface of a heatsink in the above step (a), and FIG. 1B is a schematic side view of the heatsink in the above step (a). As shown in FIGS. 1A and 1B, two double-sided adhesive tapes 13-1 and 13-2 are stuck along the opposing two sides of an adhesion surface of the heatsink 11. The double-sided adhesion tapes 13-1 and 13-2 are used for temporarily fixing the heatsink 11 and the semiconductor device 15 together until the adhesive cures. Even after the adhesive 14 has cured, the two double-sided adhesive tapes remain stuck though the fixing between the heatsink 11 and the semiconductor device 15 has been achieved by the adhesive 14. For easy explanation, the thickness of the double-sided tapes 13-1 and 13-2 has been exaggerated in FIG. 1A. The same applies in other drawings, too.

Figure 2A:
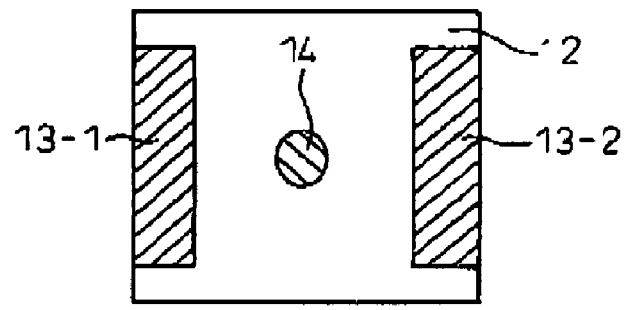
FIG. 2A is a schematic plan view of an adhesion surface of the heatsink in a step of applying an adhesive according to the conventional method for bonding the heatsink and the semiconductor device together.
Figure 2B:
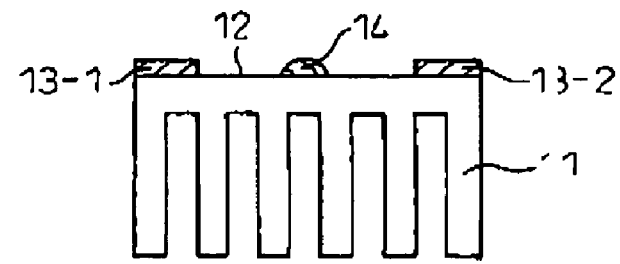
FIG. 2B is a schematic side view of the heatsink in the step of applying the adhesive according to the conventional method for bonding the heatsink and the semiconductor device together.

FIG. 2A is a schematic plan view of an adhesion surface of the heatsink in the above step (b), and FIG. 2B is a schematic side view of the heatsink in the above step (b). As shown in FIGS. 2A and 2B, the adhesive 14 is applied in a suitable amount onto nearly the center of the adhesion surface 12 of the heatsink 11.

Figure 3A:
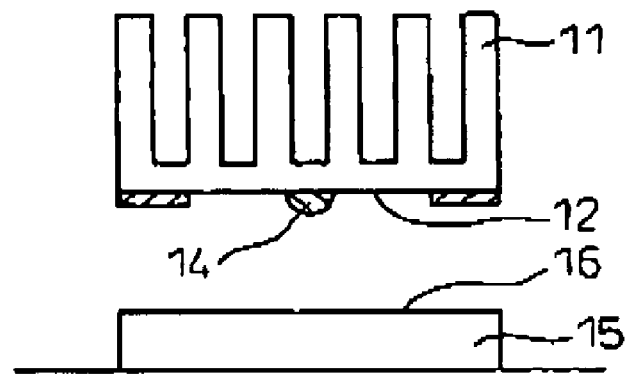
FIG. 3A is a schematic side view of before the heatsink and the semiconductor device are bonded together in the step of bonding the heatsink and the semiconductor device together according to the conventional method for bonding the heatsink and the semiconductor device together.
Figure 3B:
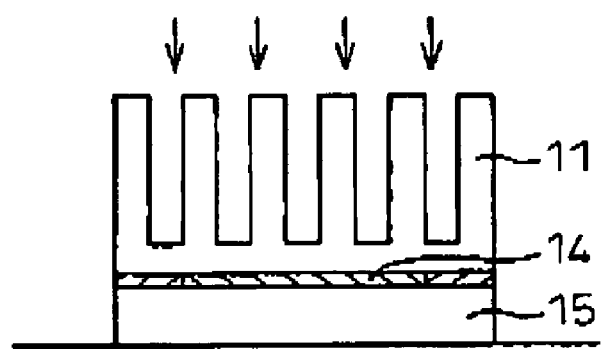
FIG. 3B is a schematic side view of after the heatsink and the semiconductor device are bonded together in the step of bonding the heatsink and the semiconductor device together according to the conventional method for bonding the heatsink and the semiconductor device together.

Further, FIGS. 3A and 3B are schematic side views of the heatsink and the semiconductor device in the above step (c). Referring to FIG. 3A, when the heatsink 11 and the semiconductor device 15 are to be bonded together, the adhesion surface 12 of the heatsink 11 and the adhesion surface 16 of the semiconductor device 15 are maintained nearly in parallel. The heatsink 11 is gradually brought close to the semiconductor device 15. Referring to FIG. 3B, the heatsink 11 is brought into contact with the semiconductor device 15 and is, then, pushed onto the semiconductor device 15 to uniformly spread the adhesive 14 over the whole adhesion surface. Thereafter, the adhesive 14 cures to exhibit a predetermined adhering strength; i.e., adhesion is completed.

However, the conventional method uses two double-sided adhesive tapes (13-1 and 13-2) having a heat resistance greater than a heat resistance of the adhesive 14. Therefore, the adhesive 14 is allowed to occupy only a decreased area of the adhesion surfaces of the heatsink 11 and the semiconductor device 15, making it difficult to increase the heat-radiating efficiency relying upon the heatsink 11.

Further, when there is used a highly viscous adhesive agent 14, the adhesive 14 flows in between the double-sided adhesive tapes 13-1, 13-2 and the semiconductor device 15 at the time of spreading the adhesive 14 by pushing the heatsink 11 in the above step (c) causing a decrease in the fixing strength during the period of temporary fixing.

Next, described below is a method for bonding a heatsink and a semiconductor device together according to an embodiment of the present invention.

In the method for bonding the heatsink and the semiconductor device together according to the embodiment of the present invention, the double-sided adhesive tape is stuck to one side only of the heatsink. Therefore, the double-sided adhesive tape occupies a decreased area on the adhesion surfaces of the heatsink and the semiconductor device as compared to that of the conventional method. Accordingly, the heatsink and the semiconductor device are bonded together over a wide range by the adhesive that has a heat resistance smaller than the heat resistance of the double-sided adhesive tape. This enhances the efficiency for radiating the heat generated by the semiconductor device.

When the heatsink and the semiconductor device are to be bonded together, further, an end portion of the double-sided adhesive tape stuck to the heatsink is brought into contact with an end portion of the adhesion surface of the semiconductor device, and is turned about the contacting end portion as an axis. The adhesive is pushed by the semiconductor device accompanying the turn. This prevents the adhesive from flowing into between the double-sided adhesive tape and the semiconductor device. Here, use of only one double-sided adhesive tape is enough for a temporary fixing.

Described below in detail with reference to the drawings is the method for bonding the heatsink and the semiconductor device together according to the embodiment of the present invention.

FIG. 4 is a flowchart illustrating the method for bonding the heatsink and the semiconductor device together according to the embodiment of the present invention. At step S101, first, the double-adhesive tape for temporary fixing is stuck along one side of the adhesion surface of the heatsink. Next, at step S102, the adhesive is applied to nearly the center of the heatsink. At step S103, a portion of the heatsink to where the double-sided adhesive tape is stuck is brought into contact with an end portion of the adhesion surface of the semiconductor device. Finally, at step S104, the heatsink is turned with the above contact portion as an axis of rotation so as to be adhered to the semiconductor device.

Figure 5A:
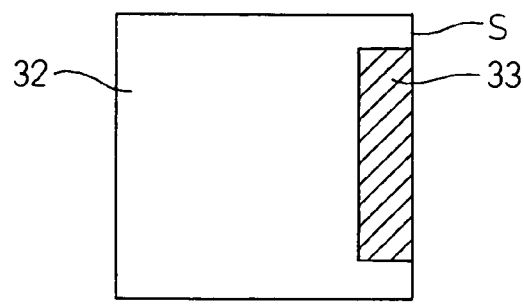
FIG. 5A is a schematic plan view of an adhesion surface of the heatsink in a step of sticking a double-sided adhesive tape for temporary fixing in a method for bonding the heatsink and the semiconductor device together according to an embodiment of the present invention.
Figure 5B:
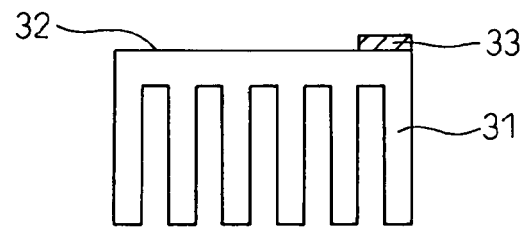
FIG. 5B is a schematic side view of the heatsink in the step of sticking the double-sided adhesive tape for temporary fixing in the method for bonding the heatsink and the semiconductor device together according the embodiment of the present invention.

FIG. 5A is a schematic plan view of the adhesion surface 32 of the heatsink 31 used at step S101. FIG. 5B is a schematic side view of the heatsink 31 used at step S101. At step S101 as shown in FIGS. 5A and 5B, the double-sided adhesive tape 33 is stuck along one side, i.e., alone the side S that is shown of the adhesion surface 32 of the heatsink 31. The double-sided tape 33 need not necessarily be in contact with one side of the adhesion surface 32. As will be described later, however, it is desired that the double-sided adhesive tape 33 is so stuck as to come in contact with the end portion of the adhesion surface 36 of the semiconductor device 35 when the heatsink 31 is brought into contact with the semiconductor device 35. As the double-sided adhesive tape 33, there can be used various double-sided adhesive tapes that are usually used for bonding the heatsink and the semiconductor device together.

Figure 6A:
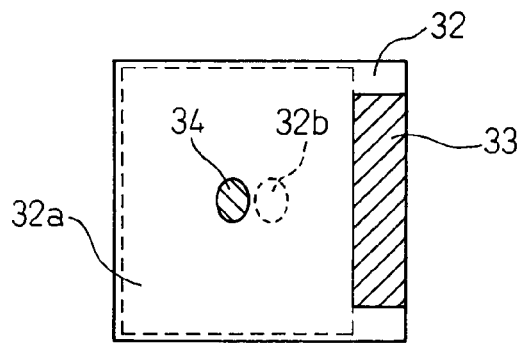
FIG. 6A is a schematic plan view of the adhesion surface of the heatsink in a step of applying an adhesive in the method for bonding the heatsink and the semiconductor device together according to the embodiment of the present invention.
Figure 6B:
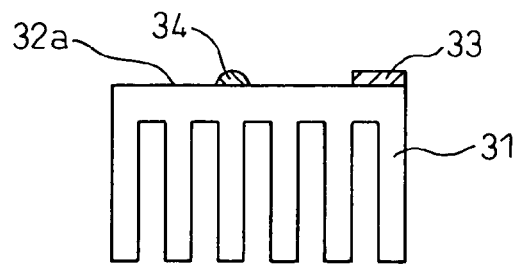
FIG. 6B is a schematic side view of the heatsink in the step of applying the adhesive according to the method for bonding the heatsink and the semiconductor device together according to the embodiment of the present invention.

Next, FIG. 6A is a schematic plan view of the adhesion surface 32 of the heatsink 31 used at step S102. FIG. 6B is a schematic side view of the heatsink 31 used at step S102. At step S102 as shown in FIGS. 6A and 6B, the adhesive 34 is applied to nearly the center of the adhesion surface 32 of the heatsink 31 on a region 32a where no double-adhesive tape 33 is stuck and which comes in contact with the adhesion surface 36 of the semiconductor device 35. A silicon adhesive can be used as the adhesive 34. However, the adhesive 34 is not limited to the silicon adhesive only. As the adhesive 34, there may be used another adhesive having a coefficient of thermal expansion nearly equal to the coefficients of thermal expansion of the heatsink 31 and of the semiconductor device 35, and having a small heat resistance. It is further desired that the adhesive 34 is applied in an amount which is just enough for covering the whole region 32a when the heatsink 31 and the semiconductor device 35 are adhered together.

Figure 7A:
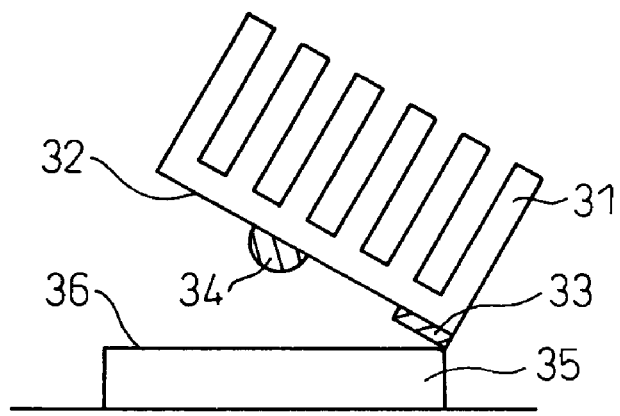
FIG. 7A is a schematic side view of the heatsink and the semiconductor device in a step of bringing the heatsink and the semiconductor device into contact with each other in the method for bonding the heatsink and the semiconductor device together according to the embodiment of the present invention.
Figure 7B:
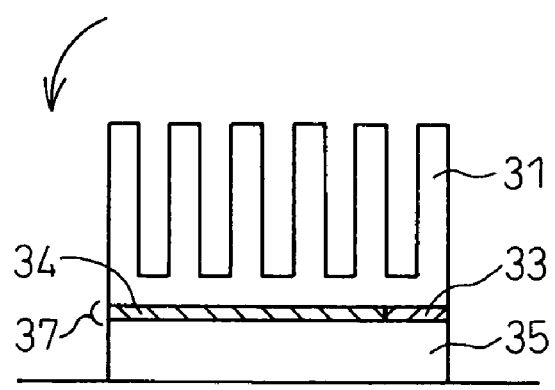
FIG. 7B is a schematic side view of the heatsink and the semiconductor device in a step of bonding the heatsink and the semiconductor device together in the method for bonding the heatsink and the semiconductor device together according to the embodiment of the present invention.

FIGS. 7A and 7B are schematic side views illustrating a procedure of bonding the heatsink 31 and the semiconductor device 35 together at steps S103 and S104. At step S103 as shown in FIG. 7A, the double-sided adhesive tape 33 stuck to the heatsink 31 is, first, brought into contact with the end portion of the adhesion surface 36 of the semiconductor device 35. That is, in a tilted state where the side stuck with the double-sided adhesive tape 33 is the lower side and the opposite side thereof is the upper side, the heatsink 31 is brought into contact with the end portion of the adhesion surface 36 of the semiconductor device 35 along the end in the lengthwise direction of the double-sided adhesive tape 33. At step S104 as shown in FIG. 7B, the heatsink 31 is turned with the contacting end portion as an axis of rotation, so that the gap becomes gradually narrower between the adhesion surface 32 of the heatsink 31 and the adhesion surface 36 of the semiconductor device 35. When the whole adhesion surface 36 of the semiconductor device 35 comes in contact with the adhesion surface 32 of the heatsink 31, the heatsink 31 is pushed onto the semiconductor device 35. Here, as the gap becomes narrower between the adhesion surface 32 and the adhesion surface 36, the adhesive 34 gradually spreads between the adhesion surfaces and, thereafter, spreads over the whole junction surfaces as the heatsink 31 is pushed.

Referring to the side view thereof of FIG. 7B, the semiconductor device formed by the bonding method of this embodiment is of a constitution in which an adhesive member as represented by the double-sided adhesive tape 33 and the adhesive 34 are arranged between the heatsink 31 and the semiconductor device 35. In particular, the adhesive member is formed at one end portion/one side only of the heatsink 31/semiconductor device 35, and the adhesive 34 is filled in other portion between the heatsink 31 and the semiconductor device 35. As described above, the semiconductor device formed by the bonding method of this embodiment has a characteristic structure.

Figure 8:
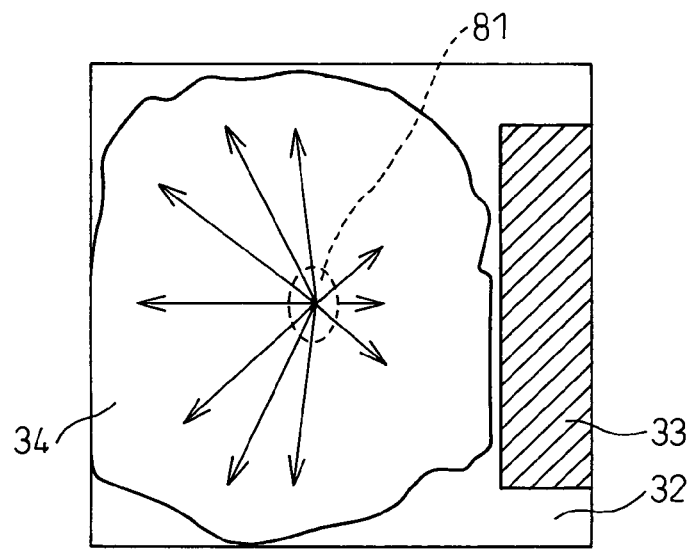
FIG. 8 is a view illustrating how the adhesive spreads on the adhesion surface.

Referring to FIG. 8, described below in detail is how the adhesive 34 spreads on the adhesion surface 32. In FIG. 8, the region 81 surrounded by a dotted line is where the adhesive 34 is applied at step S102. Arrows indicate how the adhesive 34 spreads, long arrows representing widely spreading adhesive 34. As shown in FIG. 8, the gap between the heatsink 31 and the semiconductor device 35 becomes narrower toward the double-sided adhesive tape 33. Therefore, the adhesive 34 spreads more in a direction to separate away from the double-sided adhesive tape 33 than in a direction to approach the double-sided adhesive tape 33. Therefore, even the highly viscous adhesive 34 does not flow into between the double-sided adhesive tape 33 and the semiconductor device 35. Accordingly, the double-sided adhesive tape 33 exhibits a sufficiently large fixing strength during the period of temporary fixing.

Finally, the heatsink 31 and the semiconductor device 35 are temporarily fixed by the double-sided adhesive tape 33 until the adhesive 34 is cured to complete the adhesion. An adhesive layer 37 constituted by the adhesive 34 and the double-sided adhesive tape 33 is formed between the heatsink 31 and the semiconductor device 35 which have been bonded together. Even before the adhesive 34 is completely cured, the heatsink 31 and the semiconductor device 35 temporarily fixed together can be used for another process as long as the heatsink 31 and the semiconductor device 35 are fixed to each other.

According to the method for bonding the heatsink and the semiconductor device together of the embodiment of the present invention, the double-sided adhesive tape for temporary fixing occupies a decreased area of the adhesion surfaces of the heatsink and of the semiconductor device contributing to increasing the area for bonding by using the adhesive and improving efficiency for radiating the heat generated by the semiconductor device. Further, the end portion of the double-sided adhesive tape that is stuck is brought into contact with the end portion of the adhesion surface of the semiconductor device, and the heatsink is turned with the contacting portion as an axis of rotation and is pushed onto the semiconductor device preventing the adhesive from flowing into between the double-sided adhesive tape and the heatsink. Therefore, a sufficiently large fixing strength is maintained during the period of temporary fixing despite of a decrease in the area of the adhesion surface occupied by the double-sided adhesive tape.

The present invention is not limited to the above embodiment only. At step S101, for example, the double-sided adhesive tape 33 may be stuck to the semiconductor device 35 instead of being stuck to the adhesion surface 32 of the heatsink 31. When the adhesion surface 36 of the semiconductor device 35 is smaller than the adhesion surface 32 of the heatsink 31, in particular, the double-sided adhesive tape 33 can be easily stuck to a suitable position rather than being suck to the adhesion surface 32 of the heatsink 31. That is, the double-sided tape 33 can be easily stuck along one side of the adhesion surface 36 of the semiconductor device 35. At step S102, similarly, the adhesive 34 may be applied onto the semiconductor device 35.

Alternatively, the order of steps S101 and S102 above may be reversed.

Alternatively, the semiconductor device 35 may be moved instead of moving the heatsink 31 at steps S103 and S104.

At step S102, further, the adhesive 34 may be applied onto a position slightly close to the double-sided adhesive tape 33 away from the center of the region 32a as represented by a region 32b of a dotted line in FIG. 6A. When the heatsink 31 is bonded to the semiconductor device 35 as described above, the adhesive 34 tends to spread toward the side opposite to the side of the double-sided adhesive tape 33. Therefore, the adhesive 34 is applied onto a position close to the double-sided adhesive tape 33 away from the center of the region 32a, so that the adhesive agent 34 easily spreads over the whole adhesion surfaces.

Further, the double-sided adhesive tape 33 may be stuck to the vicinity of any one of the four corners of the adhesion surface 32 of the heatsink 31 instead of being stuck along any side of the adhesion surface 32 of the heatsink 31. In this case, at step S103, the corner portion to where the double-sided adhesive tape 33 is stuck is brought into contact, first, with the corresponding corner of the semiconductor device 35, and the heatsink 31 is turned with the contacting corner portion as a center of rotation and is pushed onto the semiconductor device 35.

The above steps can be executed not only by the operator but also by the adhering device which is so constituted as to execute the above-mentioned steps.

Figure 9:
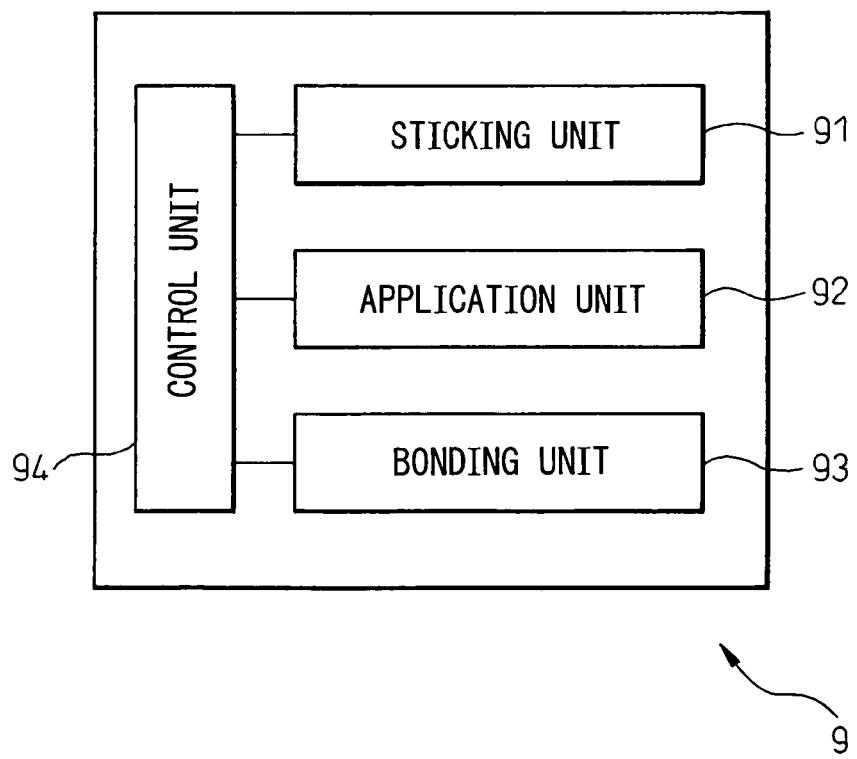
FIG. 9 is a functional block diagram of a device for bonding the heatsink and the semiconductor device together according to the embodiment of the present invention.

FIG. 9 is a functional block diagram of a device for bonding the heatsink and the semiconductor device together according to the present invention.

The device 9 for bonding includes a sticking unit 91 for sticking the double-sided adhesive tape for temporary fixing to an end of the heatsink, an application unit 92 for applying the adhesive onto nearly the center of the heatsink, an bonding unit 93 for bonding the heatsink to the semiconductor device, and a control unit 94 connected to the above units to control them.

The sticking unit 91 includes a tape reel, a tape drawer and a cutter. The tape reel feeds the double-adhesive tape 33. The tape drawer draws the double-adhesive tape 33 from the tape reel and sticks it to a predetermined position on the adhesion surface 32 of the heatsink 31. The cutter cuts the double-sided adhesive tape 33 into a desired length.

The application unit 92 includes a tank and an applicator. The tank temporarily stores the adhesive 34 and feeds it to the applicator which applies the adhesive 34 onto a predetermined position on the adhesion surface 32 of the heatsink 31.

The bonding unit 93 includes an XY stage and a robot arm. The XY stage holds the semiconductor device 35. The XY stage can be moved in a two dimensional manner on a horizontal plane, and works to move the semiconductor device 35 to a predetermined position. The robot arm, on the other hand, holds the heatsink 31. The robot arm is capable of moving the heatsink 31 up and down and of turning it to thereby carry out the operations of steps S103 and S104.

The mechanism constituting the above portions can be realized by using conventional mechanical devices. The control unit 94, too, can be realized by using known parts such as a central processing unit (CPU) and a memory, as well as a computer program that operates on the CPU. Therefore, detailed structures of the above units are not described here.

The above description has dealt with an embodiment of the present invention to which only, however, the invention is in no way limited. Upon making a reference to the above description and comprehending it, many and other embodiments may become obvious for people skilled in the art. Upon making a reference to the accompanying claims, therefore, the scope of the invention shall be judged in a range where there is obtained a maximum of right of claims.

The invention claimed is:

1. A method for bonding a heatsink and a semiconductor device together comprising the steps of:
    sticking a double-sided adhesive tape only to one of a plurality of end portions of an adhesion surface of either of said heatsink or said semiconductor device;
    applying an adhesive onto the adhesion surface of at least either said heatsink or said semiconductor device;
    bringing said one of the plurality of end portions of said heatsink or said semiconductor device to which said double-sided adhesive tape has been stuck into contact with a corresponding end portion of the other one of said heatsink or said semiconductor device; and
    relatively turning said heatsink and said semiconductor device with said contacting portion as a rotation center to bond together regions where no double-sided adhesive tape has been stuck on the adhesion surfaces of said heatsink and said semiconductor device by said adhesive.

2. A method for bonding according to claim 1, wherein in said step of contact, a portion corresponding to said one end portion of said heatsink is any side of the adhesion surface of said semiconductor device.

3. A method for bonding according to claim 1, wherein in said step of applying adhesive, said adhesive is applied onto a portion of said adhesion surface, and the portion where the adhesion is applied is nearly the center of a region where no double-sided adhesive tape has been stuck on said adhesion surface of said heatsink or said semiconductor device.

4. A method for bonding according to claim 1, wherein in said step of application, said adhesive is applied onto a portion of said adhesion surface, and the portion lies closer to said double-sided adhesive tape than the center of a region where no double-sided adhesive tape has been stuck on the adhesion surface of said heatsink or said semiconductor device.

* * * * *